US010845446B2

(12) United States Patent
Reeder et al.

(10) Patent No.: US 10,845,446 B2
(45) Date of Patent: Nov. 24, 2020

(54) SYSTEM AND METHOD FOR DETERMINING PATIENT PARAMETERS USING RADIO FREQUENCY PHASE INCREMENTS IN MAGNETIC RESONANCE IMAGING

(71) Applicant: Wisconsin Alumni Research Foundation, Madison, WI (US)

(72) Inventors: Scott B. Reeder, Middleton, WI (US); Xiaoke Wang, Madison, WI (US)

(73) Assignee: WISCONSIN ALUMNI RESEARCH FOUNDATION, Madison, WI (US)

( * ) Notice: Subject to any disclaimer, the term of this patent is extended or adjusted under 35 U.S.C. 154(b) by 27 days.

(21) Appl. No.: 16/393,806

(22) Filed: Apr. 24, 2019

(65) Prior Publication Data

US 2020/0341090 A1 Oct. 29, 2020

(51) Int. Cl.
*G01R 33/50* (2006.01)
*G01R 33/54* (2006.01)
*G01R 33/563* (2006.01)

(52) U.S. Cl.
CPC .......... *G01R 33/50* (2013.01); *G01R 33/543* (2013.01); *G01R 33/56341* (2013.01)

(58) Field of Classification Search
CPC . G01R 33/50; G01R 33/543; G01R 33/56341
See application file for complete search history.

(56) References Cited

U.S. PATENT DOCUMENTS

| 6,628,116 B1* | 9/2003 | Kraft | G01R 33/565 |
| | | | 324/307 |
| 2009/0134871 A1* | 5/2009 | Yui | G01R 33/5635 |
| | | | 324/309 |
| 2011/0194746 A1* | 8/2011 | Riederer | G01R 33/5635 |
| | | | 382/131 |

OTHER PUBLICATIONS

Aherne T, et al. Diagnosis of acute and chronic cardiac rejection by magnetic resonance imaging: a non-invasive in-vivo study. J Cardiovasc Surg (Torino) 1988;29(5):587-90.
Aletras AH, et al. ACUT2E TSE-SSFP: a hybrid method for T2-weighted imaging of edema in the heart. Magn Reson Med 2008;59(2):229-35.
Brittain JH, et al. Coronary angiography with magnetization-prepared T2 contrast. Magn Reson Med 1995;33(5):689-96.
Brookes JA, et al. Accuracy of T1 measurement in dynamic contrast-enhanced breast MRI using two- and three-dimensional variable flip angle fast low-angle shot. Journal of Magnetic Resonance Imaging 1999;9(2):163-171.
Bydder M, et al. Constraining the initial phase in water-fat separation. Magnetic Resonance Imaging 2011;29(2):216-221.
(Continued)

*Primary Examiner* — G. M. A Hyder
(74) *Attorney, Agent, or Firm* — Quarles & Brady LLP

(57) ABSTRACT

A system and method are provided for controlling a magnetic resonance imaging system to perform a gradient echo pulse sequence that includes varying a phase of an RF pulse of the gradient echo pulse sequence between repetitions and acquire complex MR data. The method includes processing the complex MR data to determine signal contributions from transverse relaxation (T2) in the subject, generating a quantitative T2 map of the subject using the signal contributions from T2 in the subject, and displaying the quantitative T2 map.

24 Claims, 6 Drawing Sheets

(56) References Cited

OTHER PUBLICATIONS

Cheng H-LM, et al. Rapid high-resolution T1 mapping by variable flip angles: Accurate and precise measurements in the presence of radiofrequency field inhomogeneity. Magnetic Resonance in Medicine 2006;55(3):566-574.

Crawley AP, et al. Elimination of transverse coherences in FLASH MRI. Magn Reson Med 1988;8(3):248-60.

De Bazelaire CM, et al. MR imaging relaxation times of abdominal and pelvic tissues measured in vivo at 3.0 T: preliminary results. Radiology 2004;230(3):652-9.

Deoni SC, et al. Rapid combined T1 and T2 mapping using gradient recalled acquisition in the steady state. Magn Reson Med 2003;49(3):515-26.

Deoni SC. Correction of main and transmit magnetic field (B0 and B1) inhomogeneity e?ects in multicomponent-driven equilibrium single-pulse observation of T1 and T2. Magn Reson Med 2011;65(4):1021-1035.

Dolan RS, et al. Multiparametric Cardiac Magnetic Resonance Imaging Can Detect Acute Cardiac Allograft Rejection After Heart Transplantation. JACC Cardiovasc Imaging 2019.

Foltz WD, et al. Optimized spiral imaging for measurement of myocardial T2 relaxation. Magn Reson Med 2003;49(6):1089-97.

Gold GE, et al. Musculoskeletal MRI at 3.0 T: relaxation times and image contrast. AJR American journal of roentgenology 2004;183(2):343-351.

Hamilton G, et al. In vivo breath-hold (1) H MRS simultaneous estimation of liver proton density fat fraction, and T1 and T2 of water and fat, with a multi-TR, multi-TE sequence. J Magn Reson Imaging 2015;42(6):1538-1543.

Hamilton G, et al. In vivo characterization of the liver fat (1)H MR spectrum. NMR Biomed 2011;24(7):784-790.

Heule R, et al. Triple echo steady-state (TESS) relaxometry. Magn Reson Med 2014;71(1):230-7.

Horng DE, et al. Comparison of R2 correction methods for accurate fat quantification in fatty liver. J Magn Reson Imaging 2013;37(2):414-422.

Hu HH, et al. ISMRM workshop on fat-water separation: insights, applications and progress in MRI. Magn Reson Med 2012;68(2):378-88.

Hurley SA, et al. Simultaneous Variable Flip Angle—Actual Flip Angle Imaging (VAFI) Method for Improved Accuracy and Precision of Three-dimensional T1 and B1 Measurements. Magnetic Resonance in Medicine 2012;68(1):54-64.

Juras V, et al. A comparison of multi-echo spin-echo and triple-echo steady-state T2 mapping for in vivo evaluation of articular cartilage. Eur Radiol 2016;26(6):1905-12.

Kosta P, et al. MRI evaluation of the basal ganglia size and iron content in patients with Parkinson's disease. J Neurol 2006;253(1):26-32.

Li X, et al. In vivo T(1rho) and T(2) mapping of articular cartilage in osteoarthritis of the knee using 3 T MRI. Osteoarthritis Cartilage 2007;15(7):789-97.

Liney GP, et al. Comparison of conventional single echo and multi-echo sequences with a fast spin-echo sequence for quantitative T2 mapping: application to the prostate. J Magn Reson Imaging 1996;6(4):603-7.

Liu CY, et al. Fat quantification with IDEAL gradient echo imaging: correction of bias from T(1) and noise. Magn Reson Med 2007;58(2):354-364.

Pykett IL, et al. Measurement of Spin-Lattice Relaxation-Times in Nuclear Magnetic-Resonance Imaging. Physics in Medicine and Biology 1983;28(6):723-729.

Quaia E, et al. Fast T2 mapping of the patellar articular cartilage with gradient and spin-echo magnetic resonance imaging at 1.5 T: validation and initial clinical experience in patients with osteoarthritis. Skeletal Radial 2008;37(6):511-7.

Scharf LL, et al. Geometry of the Cramer-Rao Bound. Signal Processing 1993;31(3):301-311.

Sollmann N, et al. Quantitative magnetic resonance imaging of the upper trapezius muscles—assessment of myofascial trigger points in patients with migraine. J Headache Pain 2019;20(1):8.

Stanisz GJ, et al. T1, T2 relaxation and magnetization transfer in tissue at 3T. Magn Reson Med 2005;54(3):507-512.

Wang X, et al. Fast T1 Correction for Fat Quantification Using a Dual-TR Chemical Shift Encoded MRI Acquisition. Proc. Intl. Soc. Mag. Reson. Med. 25 2017.

Welsch GH, et al. Rapid estimation of cartilage T2 based on double echo at steady state (DESS) with 3 Tesla. Magn Reson Med 2009;62(2):544-9.

Wood JC, et al. MRI R2 and R2 mapping accurately estimates hepatic iron concentration in transfusion-dependent thalassemia and sickle cell disease patients. Blood 2005;106(4):1460-5.

Yarnykh VL. Actual flip-angle imaging in the pulsed steady state: a method for rapid three-dimensional mapping of the transmitted radiofrequency field. Magn Reson Med 2007;57(1):192-200.

Yu H, et al. Multiecho water-fat separation and simultaneous R2 estimation with multifrequency fat spectrum modeling. Magn Reson Med 2008;60(5):1122-1134.

Zur Y, et al. Spoiling of transverse magnetization in steady-state sequences. Magn Reson Med 1991;21(2):251-63.

\* cited by examiner

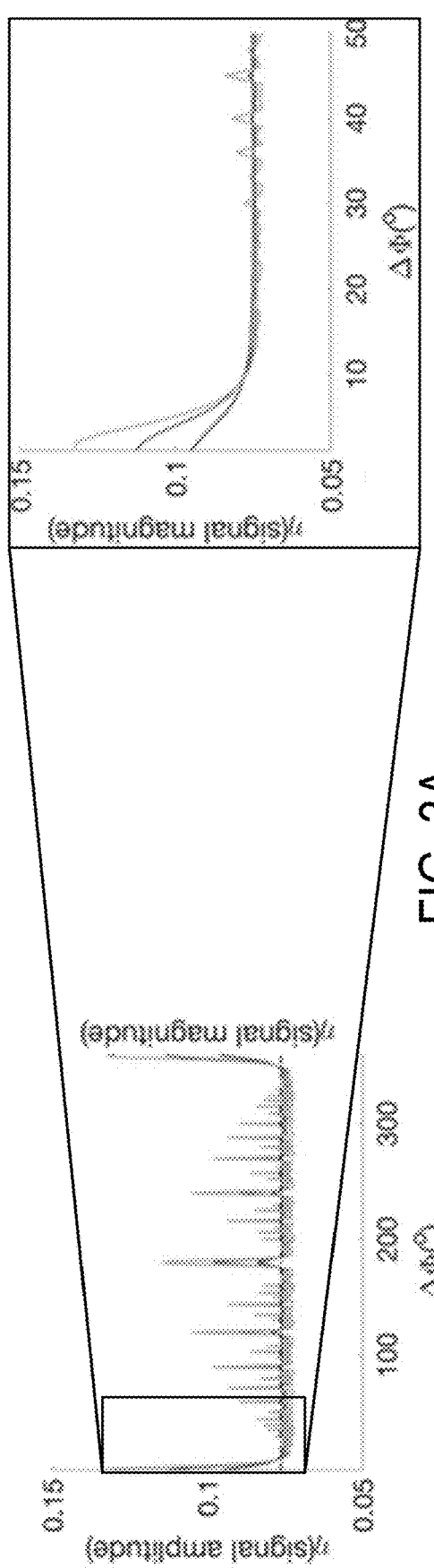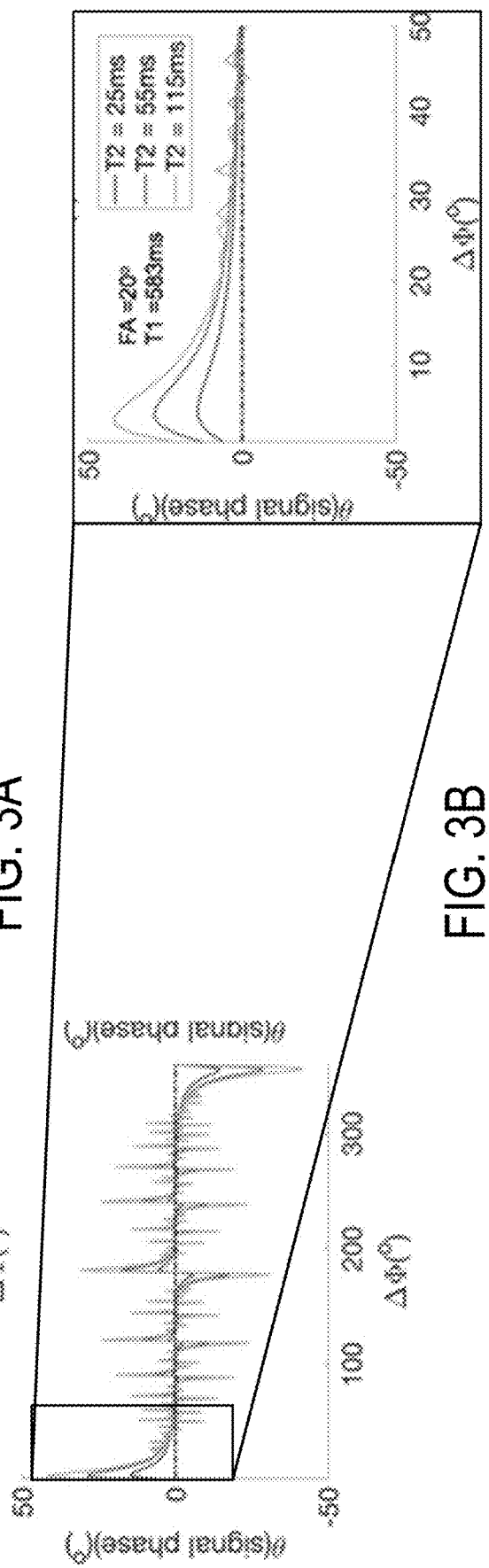
FIG. 3A
FIG. 3B

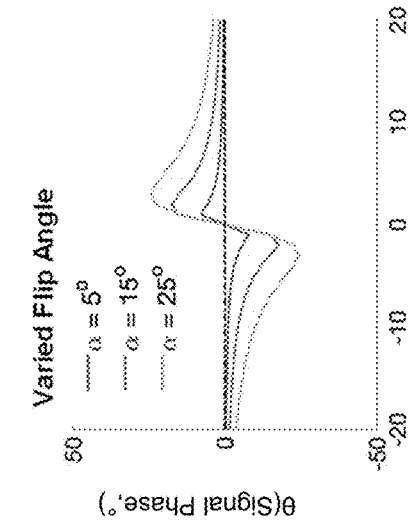
FIG. 4C
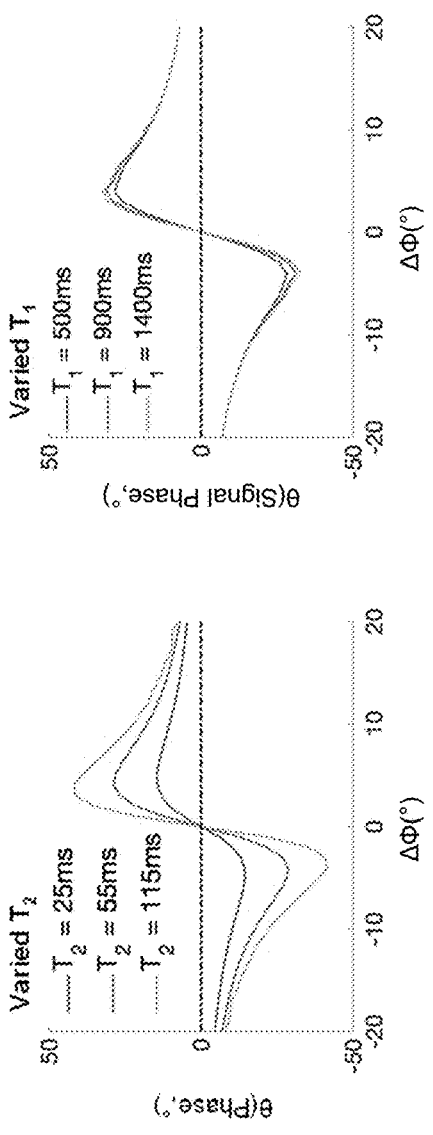
FIG. 4B
FIG. 4A
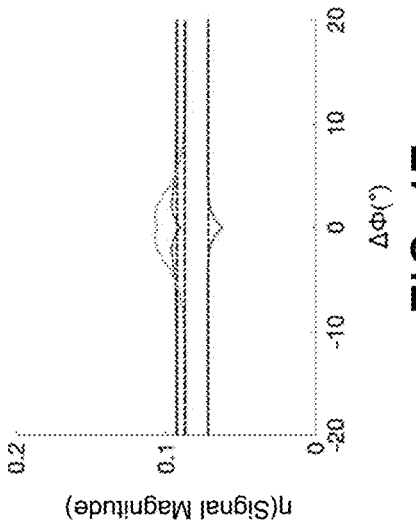
FIG. 4F
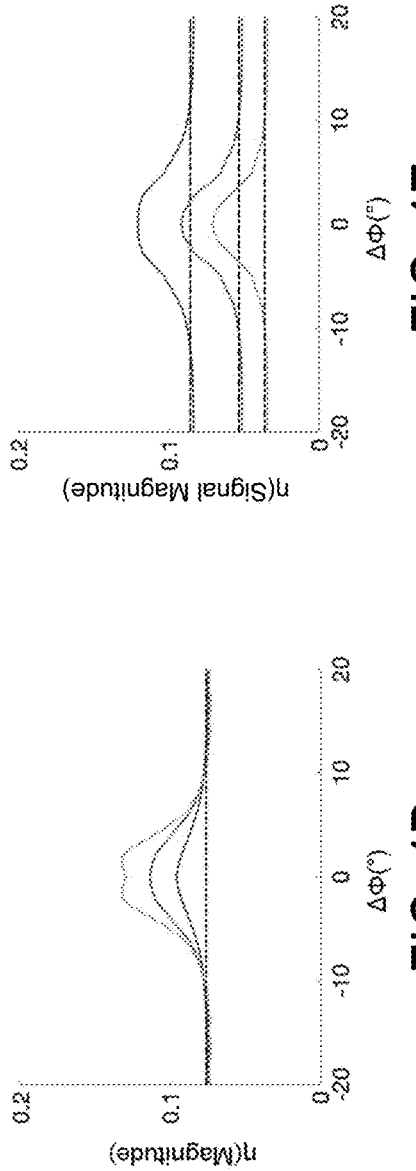
FIG. 4E
FIG. 4D

SYSTEM AND METHOD FOR DETERMINING PATIENT PARAMETERS USING RADIO FREQUENCY PHASE INCREMENTS IN MAGNETIC RESONANCE IMAGING

STATEMENT REGARDING FEDERALLY SPONSORED RESEARCH

This invention was made with government support under DK100651, DK088925, and DK102595 awarded by the National Institutes of Health. The government has certain rights in the invention.

BACKGROUND

The field of the invention is systems and methods for magnetic resonance imaging ("MRI"). More particularly, the invention relates to systems and methods for measuring spatially resolved tissue parameters using MRI systems.

When a substance, such as human tissue, is subjected to a uniform magnetic field (polarizing field B0), the individual magnetic moments of the nuclei in the tissue attempt to align with this polarizing field, but precess about it in random order at their characteristic Larmor frequency. If the substance, or tissue, is subjected to a magnetic field (excitation field, B1) that is in the x-y plane and that is near the Larmor frequency, the net aligned moment, $M_z$, may be rotated, or "tipped", into the x-y plane to produce a net transverse magnetic moment $M_{xy}$. A signal is emitted by the excited nuclei or "spins", after the excitation signal B1 is terminated, and this signal may be received and processed to form an image.

When utilizing these "MR" signals to produce images, magnetic field gradients ($G_x$, $G_y$, $G_z$) are employed. Typically, the region to be imaged is scanned by a sequence of measurement cycles in which these gradients vary according to the particular localization method being used. The resulting set of received MR signals are digitized and processed to reconstruct the image using one of many well-known reconstruction techniques.

To do so, the signals are often weighted in different ways to give preference to or consider different sub-signals or so-called contrast mechanisms. Two basic "contrast mechanisms" commonly utilized in MR imaging are the spin-lattice (or longitudinal or T1) relaxation time or spin-spin (or transverse or T2) relaxation time. However, there are a variety of other mechanisms for eliciting contrast in MRI, including T2*. Specifically, T2* is a quantity related to T2, but includes additional dephasing effects. That is, T2* is a quantity related to spin-spin relaxation and, in addition, relating microscopic and macroscopic magnetic field inhomogeneities and susceptibility effects. These contrast mechanisms can be manipulated by selecting particular imaging parameters so that clinicians can secure images that best illustrate the underlying anatomy or pathology that is the focus of the imaging study.

For example, T2 varies considerably between a variety of tissues and pathologies in the body. For example, the T2 of fluid or tissue swelling (edema) often has a prolonged T2. Similarly, the presence of iron in tissue leads to a shortening of T2. This has been used for decades to produce qualitative T2-weighted images. The transverse relaxation time has been associated with important microscopic tissue properties such as concentration and cluster-size of paramagnetic particles and the mobility of hydrogen atoms, and relates important disease processes such as iron deposition, tissue edema and fibrosis. As a result, some have evolved T2-weighted imaging into T2 mapping methods that provide quantitative T2 information. That is, where as a T2-weighted image is qualitative, T2 mapping seeks to provide a quantitative report of the T2 values of tissues. There are a wide variety of clinical applications where T2 maps can be useful, including assessment of neurodegenerative diseases, characterization of malignant lesions, detection of myocardial edema in the heart, detection of chronic rejection after heart transplant, detection of early cartilage degeneration, identification of myofascial trigger points as well as quantifying iron overload within the heart, pancreas, liver, brain, among other tissues.

There are several methods to encode T2 decay quantitatively including techniques that increase the acquisition echo time of spin echo ("SE") or fast spin echo (FSE) methods. SE-based acquisitions can be used to avoid the additional dephasing effects observed with T2* decay on the T2 data that is sought, but the SE-based acquisitions require long repetition times ("TR") to avoid an influence in the data reflecting a T1 weighting. By varying the echo time ("TE"), and fitting the acquired signals to a mono-exponential decay model (multi-exponential if a multi-component model is appropriate), T2 can be estimated reasonably accurately. Unfortunately, lengthy exams are needed for T2 mapping using SE-based acquisitions due to requirement of the long TRs. The scan time can be reduced to around 5 minutes per slice by acquiring multiple echoes (ME-SE) in a single TR.

In addition, magnetization prepared T2 contrast ("T2-prep") applications have been proposed for T2 mapping. Magnetization prepared "T2 prep" is a method used to encode T2 relaxation into the magnitude of longitudinal magnetization. This technique is advantageous for imaging blood vessels and the heart, and relies on modulation of the longitudinal magnetization prior to a readout acquisition. Although faster than SE-based acquisitions, T2-prep-based T2 quantification also suffers from relatively long acquisition times.

So-called "shorter-TR" methods based on spoiled gradient echo ("SGRE"), balanced-steady state free precession ("bSSFP"), and gradient-refocused acquisition in the steady-state ("GRASS") are more time efficient compared to SE-based T2 mapping techniques. For example, two SGRE acquisitions with varying flip angle, combined with bSSFP contains the necessary information for joint T1 and T2 estimation. This technique has been termed driven equilibrium single pulse observation of T2 ("DESPOT2"). Unfortunately, this technique, often suffers from high specific absorption ratio ("SAR"), as well as banding artifacts due to magnetic field inhomogeneities. Due to the use of short TR acquisitions, these methods can deliver simultaneous T1 and T2 quantitation of spatially resolved 3D volumes within clinically acceptable acquisition times. To further reduce scan time, some have proposed a multi-echo GRE acquisition known as double echo steady-state (DESS) that can be used for T2 estimation. This approach can also be extended for joint estimation of T1 and T2 using the triple echo steady-state (TESS) method. In these methods, T2 information is encoded into the varied T2 weighting between echoes. Although only a single gradient echo (GRE) acquisition is required, these methods rely on water specific RF pulse for fat suppression, which may be unreliable in the setting of $B_0$ inhomogeneities. Differential T2* weighting in the various echoes can also confound T2 estimates if unaccounted.

Another common contrast mechanism used in MRI is diffusion weighting. Diffusion-weighted imaging and quantitative diffusion imaging have also emerged for important research and clinical MR applications. MRI has the unique ability, as compared to other imaging modalities, to encode the diffusion of water within tissue. Tissues with altered water content or varying cellularity have different levels of quantitative diffusion within tissue. For example, the diffusion of water within acute cerebral ischemia or within highly cellular tumors is known to exhibit more restriction of diffusion. With acquisitions that are weighted by the local diffusion, these tissues exhibit less signal decay than surrounding tissues. This differential signal decay can be encoded into the magnitude of the signal and diffusion-weighted images can be generated as well as quantitative diffusion maps.

Similar to T2-weighted images and T2 mapping/quantification, all diffusion-based methods rely on the magnitude of the diffusion encoded signal. That is, each of the above-described T2 mapping techniques and diffusion weighting techniques are "magnitude-based". The magnitude of the T2-weighted or diffusion-weighted signal is fit into a signal model thought to represent the underlying physics of the MR signal in a particular tissue (e.g., mono-exponential signal decay). Magnitude-based methods are a relatively reliable approach to mapping, but do suffer from some important disadvantages including noise floor effects, particularly for T2 mapping in the presence of very short T2 values, as well as diffusion-weighted imaging which has notoriously low signal to noise ratio ("SNR") performance. Similarly, the precision of these magnitude-based methods can vary and, thereby, limit clinical utility.

The transmit $B_1$ inhomogeneity is not an inherent property of tissue. However, it is closely related to the conductivity of tissue, which reflects some histological and physiological changes. Further, the transmit $B_1$ inhomogeneity causes flip angles to deviate from nominal expected flip angle values and, thus, confound the parameter mapping methods that rely on accurate knowledge of flip angles.

The spatially resolved knowledge of $B_1$ inhomogeneity is commonly acquired by implementing actual flip angle (AFI) method or Bloch-Siegert shift based $B_1$ mapping technique. The AFI method is magnitude based and Bloch-Siegert shift based $B_1$ mapping is challenged by long scan time and high SAR.

Thus, regardless of the particular underlying acquisition technique/pulse sequence (SE-based, T2-prep-based, bSSFP-based, GRASS, DESS, TESS, DW-epi, AFI, Bloch-Siegert shift based $B_1$ mapping etc.), all have shortcomings that limit their clinical utility and/or adoption. As the demand for quantitative information in clinical medicine continues to increase, there is a need to overcome these shortcomings with traditional quantities techniques.

SUMMARY

The present disclosure overcomes the aforementioned drawbacks by providing systems and methods for encoding T2 signal decay and/or diffusion information into both the phase and the magnitude of the signal. That is, the present disclosure provides systems and methods for encoding T2, B1, and diffusion information into complex (magnitude and phase) MR signals and utilizing this, more robust information, to provide quantitative information to meet clinical demand. In one non-limiting implementation, rapid gradient echo-based techniques are utilized that include varying the radio frequency ("RF") phase of the excitation ($B_1$), and an unbalanced gradient added to the gradient echo pulse sequence. By doing so, the phase of the measured signal is encoded for T2 and depending on the acquisition parameters, $B_1$ information. If the unbalanced gradient is large enough, the signal phase can be encoded with diffusion information. Thus, using the systems and methods described herein, one has the option to create T2-weighted images, apparent diffusion coefficient (ADC) maps, quantitative T2 maps, and/or other images or reports.

In accordance with one aspect of the disclosure, a magnetic resonance imaging (MRI) system is provided that includes a magnet system configured to generate a polarizing magnetic field about at least a portion of a subject arranged in the MRI system and a plurality of gradient coils configured to apply magnetic gradients to the polarizing magnetic field. The MRI system also includes a radio frequency (RF) system configured to apply an excitation field to the subject and acquire MR image data from the subject and a computer system. The computer system is programmed to control the plurality of gradient coils and the RF system to perform a gradient echo pulse sequence that includes varying a phase of an RF pulse of the gradient echo pulse sequence between repetitions and acquire complex MR data. The computer system is also programmed to process the complex MR data to determine signal contributions from transverse relaxation (T2) in the subject and generate a quantitative T2 map of the subject using the signal contributions from T2 in the subject. The MRI system further includes a display configured to receive the quantitative T2 map from the computer and display the quantitative T2 map.

In accordance with another aspect of the disclosure, a method is provided for controlling a magnetic resonance imaging system to perform a gradient echo pulse sequence that includes varying a phase of an RF pulse of the gradient echo pulse sequence between repetitions and acquire complex MR data. The method includes processing the complex MR data to determine signal contributions from transverse relaxation (T2) in the subject, generating a quantitative T2 map of the subject using the signal contributions from T2 in the subject, and displaying the quantitative T2 map.

The foregoing and other aspects and advantages of the invention will appear from the following description. In the description, reference is made to the accompanying drawings, which form a part hereof, and in which there is shown by way of illustration a preferred embodiment of the invention. Such embodiment does not necessarily represent the full scope of the invention, however, and reference is made therefore to the claims and herein for interpreting the scope of the invention.

BRIEF DESCRIPTION OF THE DRAWINGS

FIG. 3A is a graph showing signal magnitude ($\eta$) plotted against $\Delta\Phi$ for all possible $\Delta\Phi$.

FIG. 3B is a graph showing signal phase ($\theta$) plotted against $\Delta\Phi$ for all possible $\Delta\Phi$.

FIG. 4A is a graph showing signal phase ($\theta$) plotted against $\Delta\Phi$ as varying with T2.

FIG. 4B is a graph showing signal phase ($\theta$) plotted against $\Delta\Phi$ as varying with T1.

FIG. 4C is a graph showing signal phase ($\theta$) plotted against $\Delta\Phi$ as varying with flip angle.

FIG. 4D is a graph showing signal magnitude (η) plotted against ΔΦ for as varying with T2.

FIG. 4E is a graph showing signal magnitude (η) plotted against ΔΦ for as varying with T1.

FIG. 4F is a graph showing signal magnitude (η) plotted against ΔΦ for as varying with flip angle.

DETAILED DESCRIPTION

Figure 1:
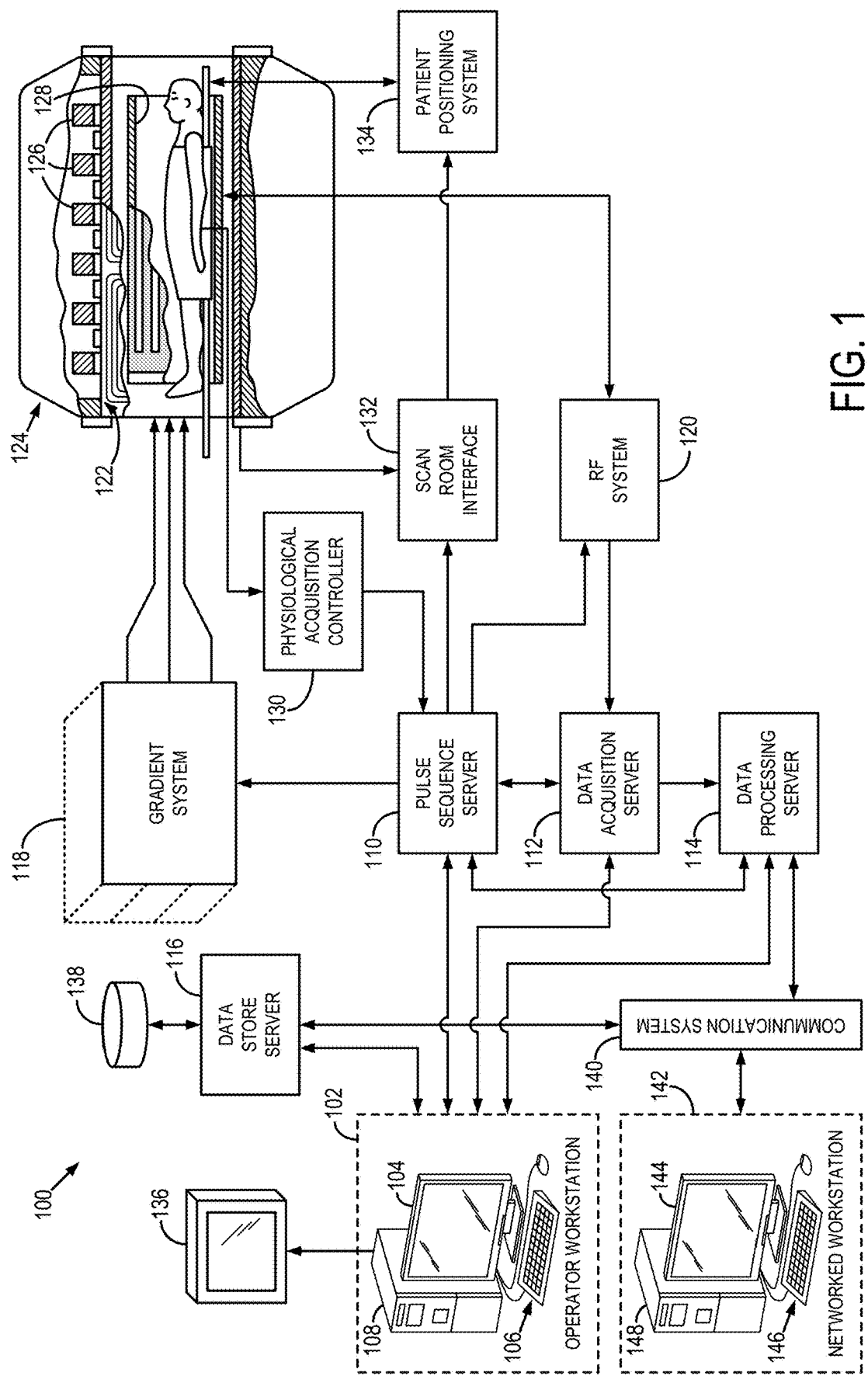
FIG. 1 is a block diagram of an exemplary magnetic resonance imaging ("MRI") system configured in accordance with the present disclosure.

Referring now to FIG. 1, these confounder-corrected approaches may be implemented using or designed to accompany a magnetic resonance imaging ("MRI") system 100, such as is illustrated in FIG. 1. The MRI system 100 includes an operator workstation 102, which will typically include a display 104, one or more input devices 106 (such as a keyboard and mouse or the like), and a processor 108. The processor 108 may include a commercially available programmable machine running a commercially available operating system. The operator workstation 102 provides the operator interface that enables scan prescriptions to be entered into the MRI system 100. In general, the operator workstation 102 may be coupled to multiple servers, including a pulse sequence server 110; a data acquisition server 112; a data processing server 114; and a data store server 116. The operator workstation 102 and each server 110, 112, 114, and 116 are connected to communicate with each other. For example, the servers 110, 112, 114, and 116 may be connected via a communication system 140, which may include any suitable network connection, whether wired, wireless, or a combination of both. As an example, the communication system 140 may include both proprietary or dedicated networks, as well as open networks, such as the internet.

The pulse sequence server 110 functions in response to instructions downloaded from the operator workstation 102 to operate a gradient system 118 and a radiofrequency ("RF") system 120. Gradient waveforms to perform the prescribed scan are produced and applied to the gradient system 118, which excites gradient coils in an assembly 122 to produce the magnetic field gradients $G_x$, $G_y$, $G_z$ used for position encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil (not shown in FIG. 1), in order to perform the prescribed magnetic resonance pulse sequence. Responsive magnetic resonance signals detected by the RF coil 128, or a separate local coil, are received by the RF system 120, where they are amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the scan prescription and direction from the pulse sequence server 110 to produce RF pulses of the desired frequency, phase, and pulse amplitude waveform. The generated RF pulses may be applied to the whole-body RF coil 128 or to one or more local coils or coil arrays.

The RF system 120 also includes one or more RF receiver channels. Each RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M = \sqrt{I^2 + Q^2} \qquad \text{Eqn. 1;}$$

and the phase of the received magnetic resonance signal may also be determined according to the following relationship:

$$\varphi = \tan^{-1}\left(\frac{Q}{I}\right); \qquad \text{Eqn. 2}$$

for positive real values, and $$\varphi = \pi + \tan^{-1}\left(\frac{Q}{I}\right)$$

for negative real values.

The pulse sequence server 110 also optionally receives patient data from a physiological acquisition controller 130. By way of example, the physiological acquisition controller 130 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, such that no data are lost by data overrun. In some scans, the data acquisition server 112 does little more than pass the acquired magnetic resonance data to the data processor server 114. However, in scans that require information derived from acquired magnetic resonance data to control the further performance of the scan, the data acquisition server 112 is programmed to produce such information and convey it to the pulse sequence server 110. For example, during prescans, magnetic resonance data are acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also be employed to process magnetic resonance signals used to detect the arrival of a contrast agent in a magnetic resonance angiography ("MRA") scan. By way of example, the data acquisition server 112 acquires magnetic resonance data and processes it in real-time to produce information that is used to control the scan.

The data processing server 114 receives magnetic resonance data from the data acquisition server 112 and processes it in accordance with instructions downloaded from the operator workstation 102. Such processing may, for example, include one or more of the following: reconstructing two-dimensional or three-dimensional images by performing a Fourier transformation of raw k-space data; performing other image reconstruction techniques, such as iterative or backprojection reconstruction techniques; applying filters to raw k-space data or to reconstructed images; generating functional magnetic resonance images; calculating motion or flow images; and so on.

Images reconstructed by the data processing server 114 are conveyed back to the operator workstation 102. Images may be output to operator display 104 or a display 136 that is located near the magnet assembly 124 for use by attending clinician. Batch mode images or selected real time images are stored in a host database on disc storage 138. When such images have been reconstructed and transferred to storage, the data processing server 114 notifies the data store server 116 on the operator workstation 102. The operator workstation 102 may be used by an operator to archive the images, produce films, or send the images via a network to other facilities.

The MRI system 100 may also include one or more networked workstations 142. By way of example, a networked workstation 142 may include a display 144, one or more input devices 146 (such as a keyboard and mouse or the like), and a processor 148. The networked workstation 142 may be located within the same facility as the operator workstation 102, or in a different facility, such as a different healthcare institution or clinic. The networked workstation 142 may include a mobile device, including phones or tablets.

The networked workstation 142, whether within the same facility or in a different facility as the operator workstation 102, may gain remote access to the data processing server 114 or data store server 116 via the communication system 140. Accordingly, multiple networked workstations 142 may have access to the data processing server 114 and the data store server 116. In this manner, magnetic resonance data, reconstructed images, or other data may exchanged between the data processing server 114 or the data store server 116 and the networked workstations 142, such that the data or images may be remotely processed by a networked workstation 142. This data may be exchanged in any suitable format, such as in accordance with the transmission control protocol ("TCP"), the internet protocol ("IP"), or other known or suitable protocols.

Figure 2:
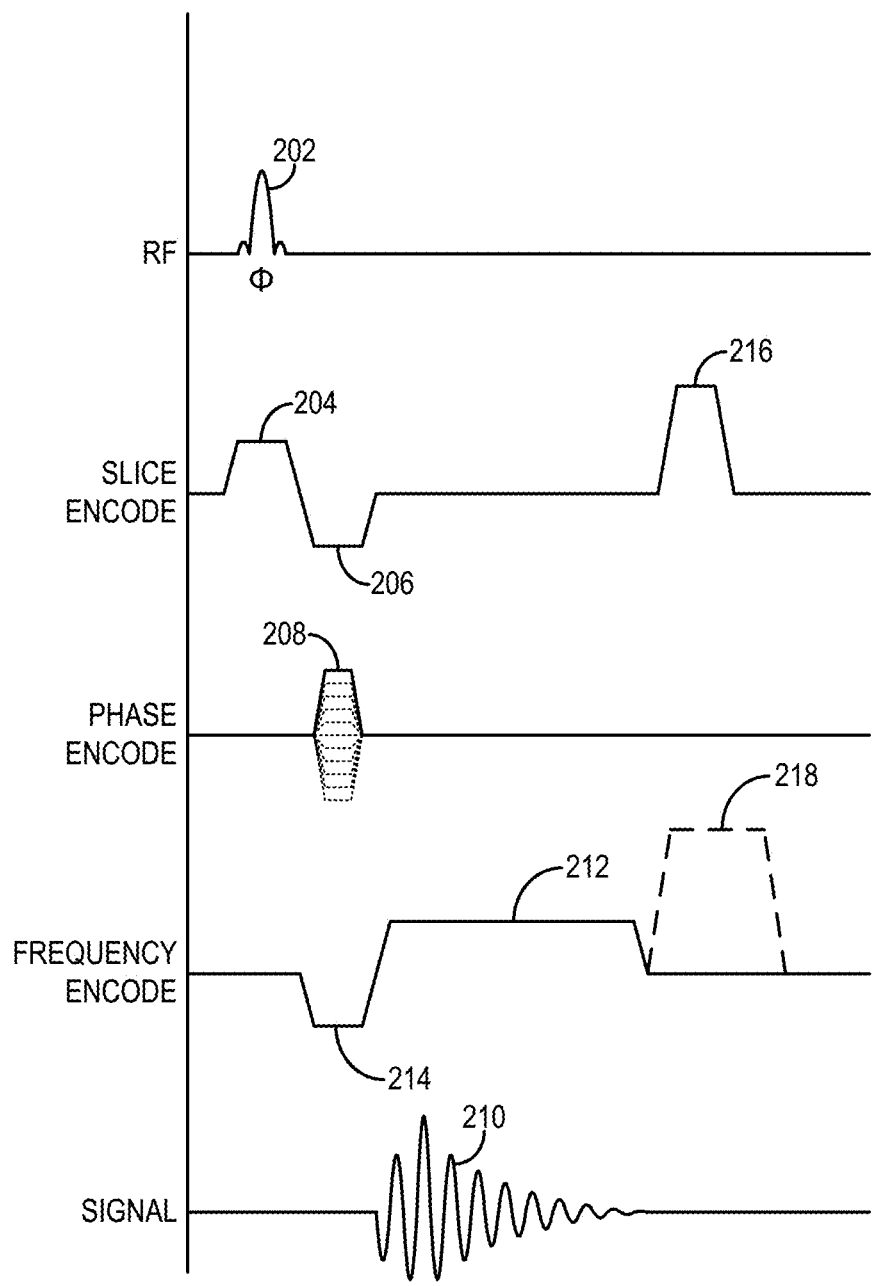
FIG. 2 is a graphic representation of an exemplary pulse sequence for directing the MRI system of Fig. s
Figure 5C:
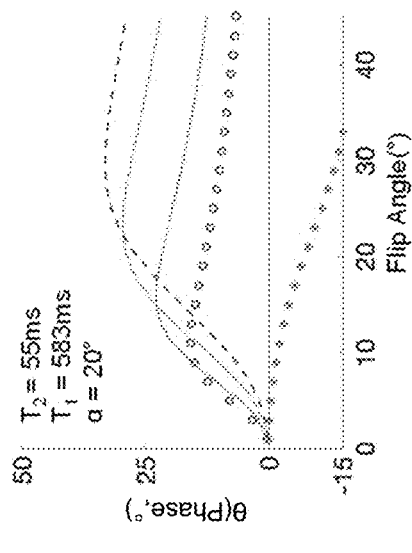
FIG. 5C is a graph showing GRE signal phase (θ) varying with flip angle.
Figure 5B:
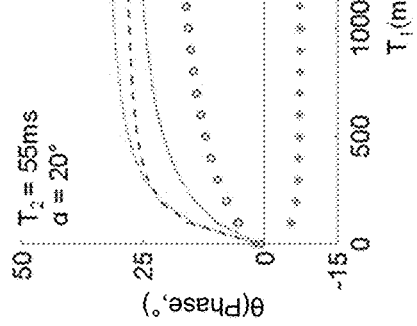
FIG. 5B is a graph showing GRE signal phase (θ) is relatively insensitive to varying T1.
Figure 5A:
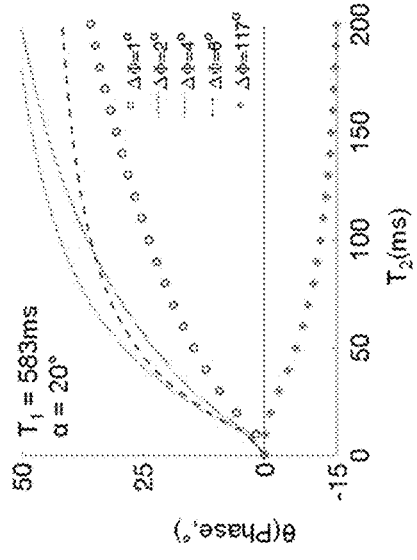
FIG. 5A is a graph showing GRE signal phase (θ) increases monotonically with increasing T2 for small RF phase increments (ΔΦ).
Figure 5F:
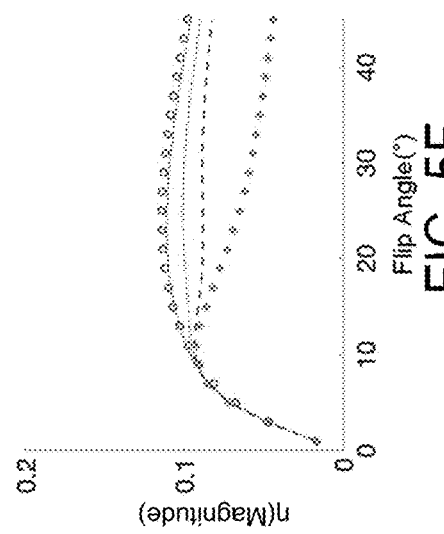
FIG. 5F is a graph showing the dependence of GRE signal magnitude (η) with varying flip angle.
Figure 5E:
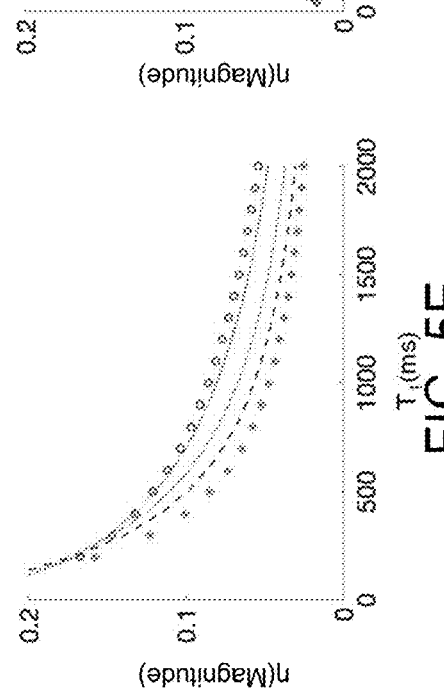
FIG. 5E is a graph showing the dependence of GRE signal magnitude (η) with varying T1.
Figure 5D:
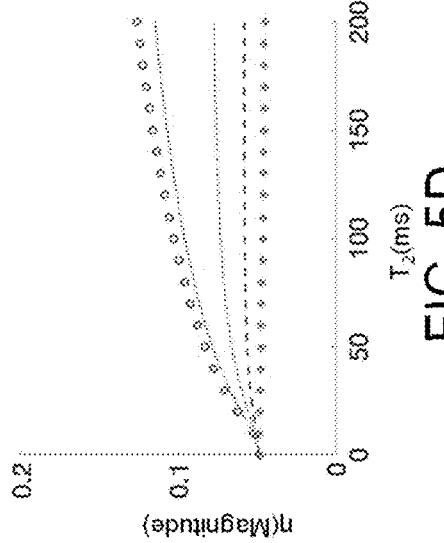
FIG. 5D is a graph showing the dependence of GRE signal magnitude (η) with varying T2.

The above-described MRI system can be used to implement a variety of pulse sequences to effectuate desired imaging studies. One common category of pulse sequence is the gradient echo ("GRE") sequence and variations thereof, such as the spoiled gradient echo ("SGRE") pulse sequence. An example pulse sequence that can be employed to direct the MRI system to acquire data in accordance with some embodiments described in the present disclosure is illustrated in FIG. 2. This example pulse sequence is a spoiled gradient ("SGRE") pulse sequence. The pulse sequence includes a radio frequency ("RF") excitation pulse 202 with a large phase increment, such as 117°, that is played out in the presence of a slice-selective gradient 204 in order to produce transverse magnetization in a prescribed imaging slice. The RF excitation pulse 202 with the large phase increment may be a spatially selective RF excitation pulse, a spectrally selective RF excitation pulse, or both. The slice-selective gradient 204 includes a rephasing lobe 206 that acts to rephase unwanted phase dispersions introduced by the slice-selective gradient 204, such that signal losses resultant from these phase dispersions are mitigated.

Following excitation of the nuclear spins in the prescribed imaging slice, a phase encoding gradient 208 is applied to spatially encode a magnetic resonance signal, representative of a gradient-recalled echo 210, along one direction in the prescribed imaging slice. A readout gradient 212 is also applied after a dephasing gradient lobe 214 to spatially encode the signal representative of the echo 210 along a second, orthogonal direction in the prescribed imaging slice. The signal representative of the echo 210 is sampled during a data acquisition window.

Unlike a standard gradient echo sequence, the GRE sequence removes a second phase encoding gradient applied after the readout gradient 212 that is a mirror image of the phase encoding gradient 208 at the beginning of the pulse sequence. Instead, the pulse sequence concludes with the application of a spoiler gradient 216 that spoils the remaining transverse magnetization. The pulse sequence is repeated and the amplitude of the phase encoding gradient 204 is stepped through a set of values such that k-space is sampled in a prescribed manner. After the desired amount of data have been acquired for the prescribed imaging slice, the pulse sequence is again repeated a plurality of times (e.g., for each phase-encoding step) while applying a different slice-selective gradient 204 to acquire data from a different imaging slice. This process is repeated until data have been acquired from the desired number of imaging slices. This sequence can be implemented with phase encoding in 2 orthogonal directions to achieve 3D imaging. In such cases, slice-selection gradient is replaced with slab-selection gradient combined with a phase encoding gradient in the slice direction. Notably, 2D imaging can also be performed. Unlike the 3D imaging application where the flip angle is known and/or uniform in a voxel and corrected for B1 inhomogeneities, in 2D applications, there is a slice profile, which means that there is a distribution of flip angles within a voxel. A Bloch equation simulation can be used to account for this effect. As will be described, the lookup table can be adapted to this end for 2D applications.

Complete spoiling of transverse magnetization is generally assumed when using spoiled gradient echo (SGRE) acquisitions, such as described above. With this assumption, the signal equation that describes the MR signal immediately after RF excitation (ignoring T2* decay for simplicity) can be written as:

$$S_{SGRE}(M_0, T_1 | \alpha, TR) = M_0 \cdot \frac{(1 - e^{-TR/T_1})\sin(\alpha)}{(1 - e^{-TR/T_1}\cos(\alpha))} \cdot e^{i\theta'}; \quad \text{Eqn. 3}$$

where $M_0$ is the magnetization at thermal equilibrium, $\alpha$ is the flip angle and $\theta'$ is the local background phase due to effects such as complex coil sensitivity, eddy currents, $B_0$ inhomogeneities, and the like. Similarly, the effects of T2* signal decay are ignored here for simplicity, which is a good assumption with short echo times (TE).

As described above with respect to FIG. 2, the RF spoiling targets the transverse magnetization. To implement RF spoiling, a sequence of phase increments of the RF excitation pulse can be used. The phase sequence is defined by the difference between the $n^{th}$ and the $(n+1)^{th}$ RF excitation, such that $\Phi(n)=\Phi_0+n\cdot\Delta\Phi(n=0, \ldots)$, where $\Phi$ is the phase difference between $n^{th}$ and the $(n+1)^{th}$ RF excitation, $\Phi_0$ is the initial phase difference, and $\Delta\Phi$ is the phase increment as n is incremented. There are a number of solutions for $\Delta\Phi$ that lead to incoherence of the steady state transverse magnetization, highly appropriate for RF spoiling. If the RF phase increment ($\Delta\Phi$) is chosen carefully, transverse magnetization accumulates in an incoherent manner and is effectively spoiled.

As an example, FIG. 3A shows simulated gradient echo magnitude and FIG. 3B shows simulated gradient echo phase of the observed signal as a function of the $\Delta\Phi$, at different T2 values. Areas that cross the perfectly spoiled theoretical signal are chosen as solutions for RF spoiling.

Thus, the choice of RF phase increment is important for effective RF spoiling. Large RF phase increments, such as 117° as has been commonly used in techniques focused on the magnitude of the signal alone, lead to excellent RF spoiling and the signal closely approximates the ideal SGRE signal magnitude in equation 3. That is, the use of phase cycling creates a pseudo-random phase of the excited signal to avoid the buildup of transverse magnetization. In this way, the steady state signal of a rapid gradient echo technique is only dependent on T1, leading to pure T1-weighted imaging. This approach has been a standard means by which "spoiling" for gradient echo imaging is performed for most commercial applications and is commonly referenced to as "spoiled gradient echo imaging."

However, contrary to the teachings of traditional techniques for pulse sequences seeking to quantify MR parameters, which seek to minimize the influence of the phase of the MR signal and utilize large RF phase increments to spoil T2 signal (e.g., phase increments of multiple tens of degrees, such as 150 degrees or 117 degrees) to rely on the magnitude of the MR signal, the present disclosure recognizes that the phase of the signal can be used to great advantage in quantification of MR parameters, such as T2. The present disclosure recognizes the dependence of the signal phase and magnitude on T2 of the tissue, at low RF phase increments ($\Delta\Phi$), as can be seen in FIGS. 3A and 3B. As can be seen from this figure for low $\Delta\Phi$ (on the order of just a few degrees), there is a strong dependence of the measured phase on the T2 of the tissue. That is, the magnitude of the signal ($\eta$) reflects moderate dependence on T2, weak dependence on flip angle for flip angles larger than 10°, and heavy dependence on T1. However, the phase presents a different story, which the present disclosure has identified and created systems and methods to create improved clinical results.

As one non-limiting example, the present disclosure can utilize a phase arrangement of $\Phi_n=\Phi_0+\Delta\Phi*(n-1)$, where $\Phi_n$ is the phase difference between $n^{th}$ and the $(n+1)^{th}$ RF excitation, $\Phi_0$ is an initial phase difference, and $\Delta\Phi$ is a selected phase increment. However, this is just one example for $\Phi_n$. As another non-limiting example, $\Phi_n=\Phi_0+\Delta\Phi*(n-1)^{\alpha}$, where $\alpha$ is a selected value, such as 0.9 or 1.1 or the like. Other RF excitation phase ordering schemes are possible and can be used to generate T2 dependent phase information in the complex GRE signal.

Thus, as will be described, the present disclosure provides systems and methods that utilize complex signals by employing RF phase increments designed to elicit the above-described signal, without causing spoiling of the T2 signal. As a non-limiting example, a phase increment may be selected to be less than 1 degree or up to 10 or 20 degrees, but substantially less than the traditional teachings of dozens or hundreds of degrees and, preferably 117 degrees, to ensure the desired spoiling when focused on the magnitude only.

This dependence of the phase on the tissue T2 values is caused by differences in the amount of transverse coherence buildup that will alter the phase in a T2 dependent matter. The present disclosure recognizes, contrary to traditional notions that discard or minimize phase information, this variation in the phase of the gradient echo signal could serve as a basis to interrogate MR parameters, such as T2, $B_1$ and diffusion with substantial advantages over traditional techniques. Thus, the present disclosure recognizes that choice of RF phase increment could be considered, which run contrary to the teachings of traditional efforts that seek effective RF spoiling because small phase increments will not be effective for RF spoiling. In considering such other phase increments, the present disclosure provides systems and methods to utilize such phase increments to yield improved results, despite the lack of RF spoiling.

FIGS. 4A-4F provide a series of graphs showing GRE signal phase ($\theta$, FIGS. 4A-4C) is heavily influenced by T2. Specifically, FIG. 4A depicts in greater detail the dependence of the signal magnitude and phase with respect to T2, T1, and flip angle over a narrow range of RF phase increments. As shown in FIGS. 5A-5F, a pronounced monotonic increase in the observed phase with T2 is noted over a wide range (10 ms to 200 ms) with RF phase increments W)) between 2° and 6°. For an RF phase increment of 2°, the signal phase is consistently sensitive to T2 over a wide range of T2 values, as shown in FIG. 4B, and flip angle, as shown in FIG. 4C, for very small RF phase increments ($\Delta\Phi$). The dependence of GRE signal magnitude ($\eta$, FIGS. 4D-4F) is shown with varying T2 (FIG. 4D), T1 (FIG. 4E), and flip angle (FIG. 4F). The phase and magnitude of the GRE signal over the low range of RF phase increments were generated using Bloch equation simulations with physiological T1 and T2 values and TR=10 ms.

Unlike the strong dependence on T2, the signal phase changes minimally over a wide range of T1 values between 100 ms and 2000 ms. With this recognition in place, the present disclosure developed a strategy to adapt the pulse sequence of FIG. 2 to use a small RF phase increment W)) to the RF pulse 202, such as 2°, to encode the tissue T2 into the signal phase.

The steady-state gradient echo signal acquired with an RF phase increment can be expressed as:

$$S(\Delta\varphi,\alpha,TR|M_0,T_1,T_2)=M_0\cdot\eta(\Delta\Phi,\alpha,TR|T_1,T_2)\cdot e^{i[\theta(\Delta\Phi,\alpha,TR|T_1,T_2)+\theta']} \quad \text{Eqn. 4;}$$

where $\eta(\Delta\Phi,\alpha,TR|T_1, T_2)$ is the signal magnitude relative to $M_0$, $\theta(\Delta\Phi, \alpha,TR|T_1, T_2)$ is the signal phase immediately after excitation and is dependent on T2, flip angle ($\alpha$), and $T_1$, and $\theta'$ is the local background phase caused by complex coil sensitivity, eddy currents, and magnetic field inhomogeneity, and the like.

As will be described, the present disclosure uses predetermined values for $\eta(\Delta\Phi, \alpha,TR|T_1, T_2)$ and $\theta(\Delta\Phi, \alpha,TR|T_1, T_2)$, such as stored in a lookup table or the like, to allow new datasets derived using small phase increments to create quantitative T2 maps. For example, lookup tables can be constructed from Bloch equation simulations with a wide range of possible $T_1$ and $T_2$ values, and the known acquisition parameters used in the experiment: $\Delta\Phi$, $\alpha$, TR.

The present disclosure further recognizes that the received signal phase contains an additional background phase term (i.e.: $\theta'$), in addition to $\theta$, as indicated in Eqn. 4. This background phase occurs because there are many contributors to the phase of the MR signal including, but not limited to, constant phase shifts related to the complex B1 coil sensitivity, off resonance B0 inhomogeneities, chemical shift, eddy currents, and many other sources of phase. In fact, this background phase can cause one to conclude that the phase resulting from T2 is not readily identifiable. That is, estimates of the signal phase resulting from T2 of the tissue must be isolated from the background phase. In accordance with the present disclosure, multiple methods to isolate $\theta$ from $\theta'$, in order to estimate tissue T2, are provided.

One approach to dealing with background phase is to employ phase subtraction. For T2 mapping, this method acquires two gradient echo acquisitions, the first with a small positive $\Delta\Phi$ (as a non-limiting example, 2°), followed by a second with a $\Delta\Phi$ of approximately the same size, but negative in value (as a non-limiting example, -2°). By performing a complex difference or phase subtraction of the two resulting images, the only residual phase information remaining will be that encoded by the T2 of the local tissue for each voxel.

In principle, two identical acquisitions with equal and opposite RF phase increments will generate opposite phase responses, as illustrated in FIGS. 4A-4C, where one can see $\theta(\Delta\Phi, \alpha, TR|T_1, T_2) = -\theta(-\Delta\Phi, \alpha, TR|T_1, T_2)$. Using two such acquisitions, $\theta$ can be isolated from $M_0$, $\eta$ and $\theta'$ in equation 4 by taking the phase difference of two gradient echo signals acquired with opposite RF phase increments, and with all other acquisition parameters identical, such that:

$$\theta(\Delta\Phi, \alpha, TR|T_1, T_2) = \frac{(\angle S(\Delta\Phi, \alpha, TR|T_1, T_2) - \angle S(-\Delta\Phi, \alpha, TR|T_1, T_2))}{2};$$ Eqn. 5 where $S(T_1, T_2; \Delta\Phi, \alpha, TR)$ is the acquired gradient signal. Given a well-chosen RF phase increment (as a non-limiting example, $\Delta\Phi=2°$) and a relatively large flip angle (as a non-limiting example, $\alpha=18°$), the estimated signal phase can be used to estimate $T_2$ with only a small error related to $T_1$ and flip angle.

Once estimates of $\theta$ are obtained, estimates of $T_2$ can be determined through the use of a lookup table generated, as a non-limiting example, from a Bloch equation simulation that uses the known TR and flip angle of the acquisition or from other simulations or experimentally-derived values. Notably, the phase is weakly dependent on T1, and therefore T1 values reported in the literature or measured by other methods can be used to generate the lookup table.

In order to account for the effects of T1, $T_1$ can also be estimated to, thereby, correct for T1 effects, by utilizing a variable flip angle (VFA)-based approach, as one example. To accomplish this objective, phase-based T2 encoding can be combined with magnitude-based T1 encoding to resolve both parameters jointly. For example, two gradient echo acquisitions can be performed with carefully selected phase increments and flip angles. For example, a first acquisition can use a small RF phase increment (as a non-limiting example, $\Delta\Phi_1=2°$) and a large flip angle (as a non-limiting example, $\alpha_1=18°$). The, a second acquisition following the first acquisition uses a small flip angle (as a non-limiting example, $\alpha_2=5°$ and the opposite RF phase increment of the first acquisition (as a non-limiting example, $\Delta\Phi_2=-2°$). The signal equation can be written as:

$$S_1 = S(\Delta\Phi_1, \alpha_1, TR|T_1, T_2) = M_0 \cdot \eta(\Delta\Phi_1, \alpha_1, TR|T_1, T_2) \cdot e^{i[\theta(\Delta\Phi_1, \alpha_1, TR|T_1, T_2) + \theta']}$$ Eqn. 6, $$S_2 = S(\Delta\Phi_2, \alpha_2, TR|T_1, T_2) = M_0 \cdot \eta(\Delta\Phi_2, \alpha_2, TR|T_1, T_2) \cdot e^{i[\theta(\Delta\Phi_2, \alpha_2, TR|T_1, T_2) + \theta']}$$ Eqn. 7

The signal magnitude $\eta$ is mostly influenced by T1. If $\eta$ can be isolated from $M_0$, it is plausible that it will provide the information needed for T1 estimation and subsequently correction of T1 effect in the T2 estimated from the signal phase. Conveniently, by taking the ratio of two complex signals, $M_0$ and $\theta'$ are eliminated. The magnitude and phase of this ratio contains a mixture of $T_1$ and $T_2$ information:

$$\frac{S_1}{S_2} = \frac{\eta(\Delta\Phi_1, \alpha_1, TR|T_1, T_2)}{\eta(\Delta\Phi_2, \alpha_2, TR|T_1, T_2)} e^{i(\theta(\Delta\Phi_1, \alpha_1, TR|T_1, T_2) - \theta(\Delta\Phi_2, \alpha_2, TR|T_1, T_2))}.$$ Eqn. 8

According to equation 8, fitting the complex ratio between the two signals, to a look up table of the magnitude ratio and phase difference, generated using Bloch equation simulation, will yield a joint estimate of T1 and T2. Similar to the method described above without T1-correction, the value of functions $\theta$ and $\eta$ can be determined from a lookup table generated using Bloch equation simulation or other simulations or derived empirically.

Apart from the two combinations of RF phase increments and flip angles proposed herein, a wide variety of combinations of gradient echo acquisitions with varied RF phase increment and flip angle can be used. As a general solution, the acquired signal phase and magnitude can be fit using equation 8 for estimation of T1 and T2.

Thus, the optimal phase increment varies with specific acquisition parameters and relaxation parameters. That is, the optimal $\Delta\Phi$ will depend on the specific T2 encoding strategy as well as the underlying signal properties of the tissue. As one non-limiting example, the phase increment may be selected to be on the order of approximately 1-6 degrees but other phase increments may be advantageous depending on the acquisition parameters and the T2 and T1 values of the tissue of interest.

The non-limiting example implementations provided above contemplate the use of sequential acquisitions of datasets at each RF phase increment. Notably, in such implementations, registration between the datasets is highly desirable. Thus, techniques for correcting misregistration may be utilized. Additionally, or alternatively, the two datasets may be acquired in an interleaved fashion, instead of sequentially.

As a non-limiting example, if an RF phase increment of 2 degrees is selected, instead of an acquisition using phases of 0, 2, 4, 6, 8, 10, . . . followed by 0, −2, −4, −6, −8, −10, . . . , an interleaved strategy may be followed such that the phases are 0, 2, −2, 4, −4, 6, −6, 8, −8, 10, −10, etc. The positive lines are used for the first dataset and the negative lines are used for the second dataset. Using an interleaved strategy, any motion artifacts are similarly distributed to both datasets, thereby avoiding or reducing misregistration artifacts.

Regardless of whether the datasets are acquired sequentially or in an interleaved fashion, or in a different arrangement, there is redundant data between the two datasets. For example, if the RF phase increment for one dataset is +2 and is −2 for the second dataset, the magnitude information is identical between the two datasets. Further, there are tremendous similarities in the phase information. This redundant information can be exploited, for example, to accelerate the acquisition of the two datasets. For example, an auto-calibrated parallel imaging technique can be used to acquire the datasets, in which case the central autocalibration lines from one dataset can be used for the other dataset. In doing so, the overall scan time is appreciably reduced. Other acceleration schemes that exploit data redundancy may also be used to reduce scan time further.

The above-described systems and methods have the ability to improve a wide variety of imaging and clinical applications. A few, non-limiting examples follow.

Applications

T2 Mapping

Figure 6:
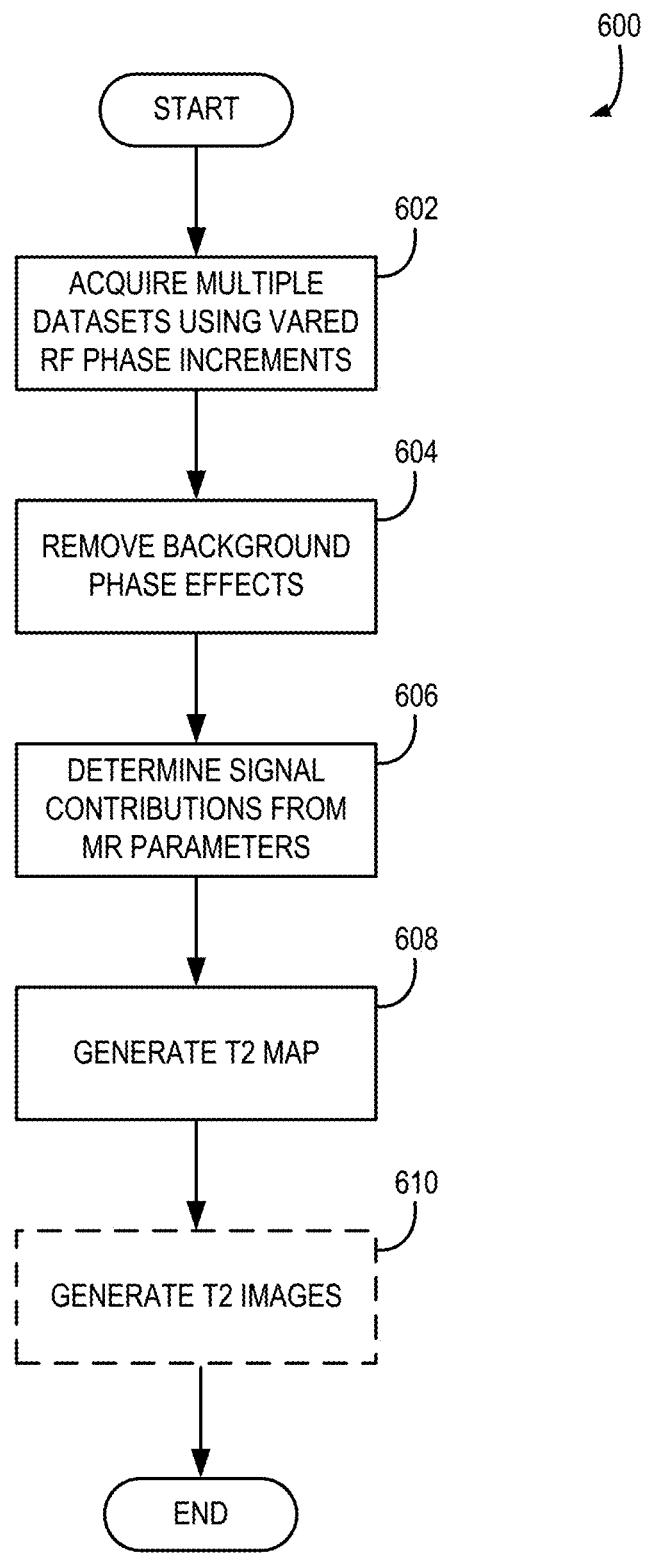
FIG. 6 is a flow chart setting forth steps of a process utilizing the system and pulse sequence of FIGS. 1 and 2 in accordance with the present disclosure.

Referring to FIG. 6, the present disclosure provides systems and methods for effectuating a complex-based T2 mapping approach 600. At process block 602, multiple datasets are acquired using two or more RF phase increments to encode T2 information within the phase information. At process block 604, the effects of T2 on the MR signal can be separated from background phase effects, as described above. One strategy is to perform two acquisitions with equal and opposite RF phase increments during the acquisition at process block 602. The, a subtraction is performed to find the difference in phase between the two gradient echo acquisitions, which removes the background phase and provides a signal that is a function of T2, T1, and a flip angle. At process block 606, the contributions of the MR parameters (e.g., T2, T1, and flip angle) can be determined. For example, equation 5 can be used to determine the function $\theta(\Delta\Phi, \alpha, TR|T1,T2)$, such as analytically or through the use of a lookup table. The values of the lookup table can be determined through the use of Bloch equation simulations, other simulations, or empirical data. By using the known acquisition parameters (TR, TE, α), as well as some estimate of the T1, an accurate measurement of T2 can be obtained from the lookup table. Thus, at process block 608, a quantitative T2 map can be generated and displayed.

In addition to T2 mapping, an optional T2-weighted image can also be generated at process block 610. One non-limiting implementation uses the difference of the two phase maps. This phase mask can be multiplied by one of the two, or a combination of the two, magnitude images in order to weight the local proton density by the phase map, which is weighted by the local T2. Thereby, a T2 image is produced and can be displayed.

Within this general example, a variety of options can be provided to the user to generate the T2 images. For example, if the T2 values of the tissue are known, a mask in the form of may $$e^{-\frac{TE}{T2}}$$

be applied, where T2 is the measured value and TE is the echo time (TE). Since TE is not predefined, the user can choose a desired TE value. In this way, the user can select the T2-weighting by selecting the TE. The above-described example and the mask of a form $$e^{-\frac{TE}{T2}}$$

is just one example and any of a variety of other forms may also be used.

Simultaneous T1 and T2 Mapping, Correction for T1 Effects

As shown above, the phase of the gradient echo acquisition has a weak dependence on a T1 of the tissue. Accurate T2 mapping and T2-weighted imaging can correct for this effect. There are several ways to achieve this. If the T1 of the local tissue is known, measured, or can be assumed from other values, then this can be worked into the lookup table. If the local T1 is unknown, then this effect can be included through the use of variability flip angle (VFA) imaging or actual flip angle (AFI) combined with the above-described phase-based T2 mapping technique. VFA and AFI methods are based on varying the flip angle and/or the TR of a gradient echo acquisition in order to encode T1-weighted information into the magnitude of the signal and can be combined with the method described above with respect to FIG. 6 that encodes information through the RF phase increment. For example, two gradient echo acquisitions that have different RF phase increments and also different flip angles can be acquired to encode both T2 and T1 weighted information at process block 602. Using a nonlinear joint fitting to a model of the complex gradient echo signal model provides simultaneous T2 maps and T1 maps.

Similarly, with a sufficient a number of data points (as a non-limiting example, 3 images or more), simultaneous T2, T1 mapping corrected for B1 inhomogeneity can also be acquired. Flip angle is a factor in addition to T1 and T2 that affects the signal phase in GRE signal with the phase arrangement described above. By varying the weighting of the flip angle in the signal phase, B1 inhomogeneity can be estimated and corrected for.

Finally, an additional way to perform simultaneous B1 correction is by varying TR at process block 602. Please see the attached abstract by Roberts et al describing this strategy. AFI allows fast and accurate 3D B1 measurements through repeated SGRE excitations with identical flip angles and alternating repetitions. A joint estimation, including a term for B1 inhomogeneity (β), from one AFI dataset and one VFA SGRE dataset can be achieved utilizing a multi-echo, fat/water separated approach. Given complete spoiling of transverse magnetization after each TR, the respective steady-state signals are as follows:

$$S_1(TR_1, TR_2, \alpha_1, \alpha_2, TE; \theta) =$$
$$(\rho_W \cdot K(TR_1, TR_2\alpha_1, \alpha_2, T1_W) + \rho_F \cdot K(TR_1, TR_2\alpha_1, \alpha_2, T1_F) \cdot C_n) \cdot$$
$$e^{-R2^* \cdot TE} \cdot e^{i(2\pi\psi \cdot TE + \phi)}$$

$$S_2(TR_1, TR_2, \alpha_1, \alpha_2, TE; \theta) =$$
$$(\rho_W \cdot K(TR_2, TR_1\alpha_2, \alpha_1, T1_W) + \rho_F \cdot K(TR_2, TR_1\alpha_2, \alpha_1, T1_F) \cdot C_n) \cdot$$
$$e^{-R2^* \cdot TE} \cdot e^{i(2\pi\psi \cdot TE + \phi)}$$

$$S_3(TR_3, \alpha_3, TE; \theta, \beta) = \left(\rho_W \frac{\sin(\beta \cdot \alpha_3) \cdot \left(1 - e^{-\frac{TR_3}{T1_W}}\right)}{1 - e^{-\frac{TR_3}{T1_W}} \cdot \cos(\beta \cdot \alpha_3)}\right) \cdot e^{-R2^* \cdot TE} \cdot e^{i(2\pi\psi \cdot TE + \phi)}$$

where:

$$K(TR_A, TR_B\alpha_A, \alpha_B, T1) =$$
$$\frac{\sin(\beta \cdot \alpha_A)\left(1 - e^{-\frac{TR_B}{T1}} + \left(1 - e^{-\frac{TR_A}{T1}}\right) \cdot 1 - e^{-\frac{TR_B}{T1}} \cos(\beta \cdot \alpha_B)\right)}{1 - e^{-\frac{TR_A}{T1}} e^{-\frac{TR_B}{T1}} \cos(\beta \cdot \alpha_A)\cos(\beta \cdot \alpha_B)};$$

$$\theta = (\beta, T1_W, T1_F, \rho_W, \rho_F, R2^*, \phi, \psi)$$

$\rho_W$=real-valued signals from water;
$\rho_F$=real-valued signals from fat;

$T1_W$=T1 of water;
$T1_F$=T1 of fat;
$\phi$=initial phase;
$\psi$=fieldmap
$\beta$ relates the transmitted flip angle ($a_T$) to prescribed flip angle ($a_P$) by the equation $a_T=\beta a_P$; and
$C_n$=6-peak spectral model for fat correction.

Thus, using the above, a B1- and fat-corrected CSE-MRI T1 mapping method is provided. This strategy combines alternating TR GRE acquisitions with traditional VFA strategies to estimate B1- and fat-corrected T1. In this way, simultaneous T2 and T1 maps, corrected for B1 inhomogeneities can also be acquired.

Combination with Chemical Shift Encoded MRI and Other Fat Suppression

Chemical shift encoded MRI (CSE-MRI) is a multi-echo acquisition that is used for a variety of applications including the separation of water and fat signals, quantification of fat, as well as quantification of T2* decay (often denoted using the inverse of T2*, ie: R2*=1/T2*). By acquiring images at multiple echo times ("TE"), the interference between water and fat signals, as well as R2* decay can be used to generate confounder-corrected proton density fat fraction (PDFF) and R2* maps. If a CSE-MRI acquisition was acquired using the gradient echo strategy described above with low phase increments, two acquisitions with alternating phase increments, the resulting phase information can be separated through a phase subtraction technique and combined with CSE-MRI. This allows for T2 mapping of both the water and fat components of the signal, in addition to generation of an R2* (1/T2*) map.

Other types of fat suppression beyond CSE-MRI may also be used. As non-limiting example, these may include spectrally-selective fat saturation, water-selective "spatial-spectral" excitation pulses, short interval time recovery (STIR) methods, and the like.

Quantitative Diffusion Mapping

The data acquisition at step 602 can be further modified to acquire data that is sensitized to diffusion. Specifically, referring to FIG. 2, a large monopolar gradient 218 can be played out with each TR of a gradient echo acquisition such that the transverse magnetization is diffusion-weighted. That is, as illustrated as an option, the large monopolar gradient 218 may be added to effect diffusion weighting. That is, gradient echo acquisition is performed without a large gradient at the end of the TR, as well as a second acquisition with a large gradient at the end of the TR. With sufficient diffusion weighting, the overall magnitude of the transverse coherence is influenced, and therefore the phase of the gradient echo signal reflects the diffusion weighting, particularly at low $\Delta\Phi$ (as a non-limiting example, two degrees). Thus, in a similar manner, the quantitative diffusion information of the tissue can be encoded into the phase of the signal.

In one implementation, if diffusion weighting is used at process block 602, two acquisitions with opposite phase increments can be used as a phase subtraction approach. However, as described, other phase subtraction approaches are also possible. Generally, any fitting or subtraction method that estimates or removes background phase in order to isolate the T2 and/or diffusion information encoded into the signal phase is suitable.

By acquiring multiple gradient echo images at different $\Delta\Phi$ with different diffusion encoding gradients at the end of the TR, the alteration of phase as a result of the diffusion gradient will lead to a diffusion dependent change in the signal phase. Using a Bloch equation simulation or empirical calibration, a lookup table can be used to determine the local apparent diffusion coefficient (ADC) of the tissue from a particular voxel. This approach could also be applied to diffusion tensor imaging (DTI) that requires the use of multiple diffusion encoding directions and magnitudes.

Other Applications

As one non-limiting example, all of the above-described T2 mapping, simultaneous T1/T2 mapping, and diffusion mapping approaches can be combined. As another example, the complex-based T2 mapping may be combined with phase velocity MRI methods.

All of these techniques and options can be selected between to suit the clinical need. For example, the above-described techniques may be particularly useful in the following, non-limiting and non-exhaustive clinical examples:

Assessment of neuro-vascular disease;
Assessment of cardiac conditions including edema, iron overload, and transplant rejection, and other conditions;
Assessment of liver for fibrosis, iron overload, and other conditions;
Assessment of the pancreas;
Assessment of the spleen;
Assessment of the kidney for transplant rejection and other conditions;
Assessment of the small bowel for Crohn's disease and other conditions;
Assessment of the prostate;
Gynecological assessments;
Assessment of cartilage, osteoarthritis, and other conditions;
Assessment of muscle conditions, including myopathy and chronic myofascial triggers; and
Other clinical setting where T2-weighted images are of value or T2 mapping can assist with specificity.

As described above, though previously unrecognized by experts in the field, the T2 and diffusion dependence of the phase of a gradient echo acquisition acquired with a small RF phase increment provides a new mechanism for producing clinically-insightful information. By acquiring gradient echo images at two or more RF phase increments, a novel approach to T2 weighted imaging and quantitative T2 mapping is achieved. This approach can be extended to quantitative diffusion mapping. Further, this strategy can also be combined with other approaches that encode magnitude or phase information into the transverse magnetization, such as VFA or AFI methods to encode T1-weighted information in order to facilitate simultaneous T1 measurements allowing for joint fitting of T1-corrected T2 images.

Not only can the above-described systems and methods be used for quantitative T2 mapping and quantitative diffusion mapping, but they can also could be used for T2 and diffusion-weighted imaging. A phase mask based on the T2 and/or diffusion dependent phase can be multiplied via a mask approach of the magnitude signal.

Experiments

To study the above-described encoding strategy, a Cramér-Rao lower bound (CRLB) analysis was performed on the estimators of T2 using the above-described methods. The analysis was performed with and without T1 correction. The calculation of CRLB were defined by equation 4 was generated for GRE acquisitions using Bloch equation simulations described in the theory section. Numerical derivatives of the signals were calculated with respect to the unknown parameters (i.e., T2, $M_0$). Also, T1 was treated as an unknown parameter when T1 correction was performed.

Identical independent Gaussian distribution was assumed in real and complex channels of all signals. The standard deviation of these Gaussian distribution was chosen as $2.2 \times 10^{-3} M_0$. In a GRE signal acquired with flip angle of 3° given TR of 6 ms and T1 of 800 ms, this noise standard deviation results in an SNR of roughly 20.

For the method without T1-correction, $\Delta\Phi = \pm 2°$ was chosen such that the signal phase will be sensitive to T2 in a wide range (10 ms to 200 ms). A flip angle of 18° was chosen such that the signal phase changes only mildly with varying flip angle. Similarly, $\Delta\Phi_1 = 2°$ and $\alpha_1 = 18°$ were picked for the proposed method with T1-correction along with $\Delta\Phi_2 = -2°$ and $\alpha_2 = 5°$. CRLB was calculated for the estimator of T2 by the above-described method over a wide range T1 (10~2000 ms) and T2 (1~200 ms) for TR of 10 ms. It is the ratio between relaxation times and TR rather than the relaxation times themselves which determines the signal amplitude and phase. Therefore, the results of this analysis can be extended to other values of TR.

Phantom Experiment

The accuracy of the above-described systems and methods was evaluated using a phantom constructed with varying concentrations of agarose and $NiCl_2$ to modulate the T1 and T2 relatively independently. A 4×4 grid of cylindrical vial agarose gel phantom was constructed for this experiment. Each vial was approximately 3 cm in radius and 4.8 cm in height. Each column had a distinct concentration of Agarose (0.5%, 1%, 2%, 4%) resulting in approximate $T_2$ values of 35 ms, 60 ms, 90 ms and 120 ms as measured in T2 mapping experiments described later. Each row is doped with a distinct concentration of $NiCl_2$ (0 mM, 0.5 mM, 1 mM, 2 mM), resulting in approximate T1 values of 3000 ms, 1900 ms, 1400 ms, 800 ms as measured by FSE-IR experiment.

All phantom experiments were performed on a clinical 3T MRI system (Signa Premier, GE Healthcare, Waukesha, Wis.). Single-echo SE-based T2 mapping was performed to provide a reference standard. Echo times of 11 ms, 50 ms, 100 ms, 150 ms were acquired with TR of 6 s. Other acquisition parameters included: axial scan-plane; FOV=18 cm×18 cm; acquisition matrix=128×128; number of slices=1; slice thickness=15 mm; receiver bandwidth=±83.33 kHz. Signal from multiple echoes were fit to a mono-exponential decay signal model to resolve T2 estimates on a voxel by voxel basis.

The T1 maps of the phantoms were generated using inversion recovered fast spin echo (FSE-IR) MRI. Acquisition parameters were as follows: inversion time=50 ms, 500 ms, 1000 ms, 1500 ms; TR=6000 ms; FOV=18 cm×18 cm; acquisition matrix=128×128; number of slices=1; slice thickness=15 mm; receiver bandwidth=±25 kHz. T1 estimation was performed for individual voxels using the standard inversion recovery signal model.

GRE signal was acquired with axial scan-plane, TR=5 ms; FOV=18 cm×18 cm; Matrix Size=128×128; number of slices=24; slice thickness=10 mm; receiver bandwidth=±50.1 kHz; number of signal averages=4. Two complex GRE datasets with $\Delta\Phi_1 = 2°$, $\alpha_1 = 18°$ and $\Delta\Phi_2 = -2°$, $\alpha_2 = 18°$ were acquired for the proposed method without $T_1$-correction. Another two datasets with $\Delta\Phi_1 = 2°$, $\alpha_1 = 18°$ and $\Delta\Phi_2 = 2°$, $\alpha_2 = 5°$ were acquired for the proposed method with T1-correction.

The T2 map uncorrected for T1 effect and that corrected for T1 effect were calculated for the proposed method using the reconstruction described in the theory section. For the first dataset ($\Delta\Phi_1 = 2°$, $\alpha_1 = 18°$ and $\Delta\Phi_2 = -2°$, $\alpha_2 = 18°$), where the T1 effect was not corrected for, T1 of 2300 ms was assumed. In an additional reconstruction of this dataset, the T1 measured using FSE-IR was assumed as known T1. This reconstruction is denoted as external T1-correction.

For each reconstruction by the above-described systems and methods, $T2_2$ measurements were averaged in a circular ROI in each vial, on the center slice. The averaged T2 measurements of each vial were then linearly regressed against SE T2 measurements, which was similarly averaged in ROIs chosen in the center of the vials.

In Vivo Experiments

All in vivo experiments were performed on a clinical 3T MRI system (Signa Premier, GE Healthcare, Waukesha, Wis.). The above-described methods were evaluated in vivo on healthy volunteers as a proof of feasibility after obtaining approval from our institutional review board (IRB) and informed written consent. In vivo experiments were performed in the brain, knee and abdomen. The choice of RF phase increment and flip angle are as follows: $\Delta\Phi_1 = 2°$, $\alpha_1 = 18°$ and $\Delta\Phi_2 = -2°$, $\alpha_2 = 18°$ for the above-described method without T1-correction; $\Delta\Phi_1 = 2°$, $\alpha_1 = 18°$ and $\Delta\Phi_2 = -2°$, $\alpha_2 = 5°$ for the above-described method with T1 correction. The remaining acquisition parameters are listed in the following table:

| Anatomy | Brain | Knee | Abdomen (single-echo) | Abdomen (multi-echo) |
| --- | --- | --- | --- | --- |
| Echo Time(ms) | 2.0 | 2.0 | 1.4 | 0.9, 2.0, 3.0, 4.0, 5.1 |
| Repetition Time(ms) | 5.8 | 6.1 | 3.2 | 6.4 |
| FOV(cm × cm) | 22 × 22 | 14 × 14 | 40 × 32 | 40 × 32 |
| Acquisition Matrix | 256 × 256 | 256 × 256 | 180 × 180 | 100 × 100 |
| Number of Slices | 28 | 32 | 24 | 24 |
| Slice Thickness(mm) | 4 | 3 | 10 | 10 |
| Scan Plane | Axial | Sagittal | Axial | Axial |
| Bandwidth(kHZ) | ±62.5 | ±90.9 | ±50 | ±125 |
| Parallel imaging | None | None | None | None |
| Coil | 96 Channel head coil | 8 Channel flex coil | Air coil | Air coil |
| Number of averages | 3 | 3 | 1 | 1 |
| Total Scan Time | 4'08" | 4'10" | 16"(single breath-hold) | 17"(single breath-hold) |

When performing T2 mapping using the above-described methods without T1 correction, T1 of 830 ms was assumed for the brain and abdomen, and $T_1$ of 1000 ms was assumed for the knee.

To allow separation of water and fat signals in the in the abdomen, multiple gradient echoes were acquired. The proposed method was combined with CSE-MRI in these cases. With the ISMRM Fat-Water Toolbox, water and fat signals were separated before their magnitudes and phases were used to reconstruct individual T2 maps for each chemical species.

In the brain and the knee, where longer acquisition times were allowed, single-echo SE experiments were conducted to provide reference T2 maps. The FOV covered by all slices of SE images and multi-echo SE images were colocalized with the 3D FOV of the proposed method. The acquisition matrix were chosen such that the resolution of the reference T2 maps will be the same as the above-described method. Due to the frequent use in clinical T2 routine, multi-echo SE was also performed in the brain. The FOV of multi-echo SE was colocalized with that of single-echo SE.

Cramér-Rao lower bound (CRLB) predicted favorable noise performance for T2 estimated using the proposed method for a wide range of T1 and T2 values, especially when no T1 correction was performed. For extremely short T2 and longer T2 values, the noise was too high for the estimator to be feasible for T2 estimation, which is consistent with the reduced sensitivity of the signal phase to T2 changes with such T2 values. When T1 correction was performed, the noise in T2 estimate increased. However, the increase of noise standard deviation was well under 100% and wasn't enough to make T2 quantification infeasible.

In the phantom experiment, the proposed method demonstrated close agreement with reference T2 estimates when uncorrected for T1 effect (slope=0.996, intercept=−2.187), corrected for T1 effect (slope=1.025, intercept=−3.646), and when used external T1 measurement (slope=1.054, intercept=−2.750).

Within limited scan time (4'10"), high quality T2 maps were generated by the systems and methods of the present disclosure in the knee, with respect to SNR and rendering of details. In areas where water signal was dominant, qualitative agreement was observed between the proposed method and the SE T2 map used as a reference. In some ROIs drawn upon clinically interesting anatomies (medial anterior tibial cartilage, medial posterior femoral cartilage, superficial patella cartilage, deep, patella cartilage, meniscus, muscle), similar values were measure by the proposed method and SE MRI: 28.1 ms, 28.3 ms, 23.0 ms, 32.7 ms, 38.5 ms, 30.5 ms for the proposed method uncorrected for T1 effect, 27.6 ms, 33.4 ms, 25.0 ms, 44.9, 41.2, 27.0 for the proposed method corrected for T¬1 effect, 34.6 ms, 33.4 ms, 25.0 ms, 44.9, 41.2, 27.0 for SE MRI.

Similarly-high quality T2 maps was generated by the systems and methods of the present disclosure when applied in the brain. T2 values were averaged in ROIs chosen in the basal ganglia, white matter, and grey matter for the T2 mapping methods and compared. The methods of the present disclosure measured 32.8 ms, 51.8 ms and 79.3 ms, respectively, when uncorrected for T1 effect, 29.2 ms, 49.4 ms, 79.3 ms, when corrected for T1 effect. In comparison, multi-echo SE measured 39.4 ms, 64.3 ms, 98.8 ms, and single-echo SE measured 69.9 ms, 69.9 ms, and 99.8 ms.

In the abdomen, although challenged by the short scan time, T2 maps from single-echo GRE acquisition and T2 water map was successfully reconstructed with desirable image quality. T2 values of water signal averaged in ROIs located in several anatomies were comparable to values measured using STEAM-MRS. For the systems and methods of the present disclosure with T1-correction, T2 was measured in the liver, spleen and pancreas, while corresponding values reported were by STEAM-MRS.

Thus, the present disclosure demonstrated feasibility of a complex-based T2 mapping technique. The theory and techniques for encoding the T2 information into the signal phase of a gradient echo acquisition were developed. Further, preliminary SNR performance was evaluated using CRLB analysis, and the accuracy of the method was evaluated in phantoms and in vivo experiments.

It was shown that there is a connection between relaxation of magnetization and signal phase acquired with a GRE acquisition that uses small RF phase increments to generate coherence of transverse magnetization. Based on the discovery of this connection, systems and methods were developed for encoding information into the GRE signal phase, leading to a complex-based T2 mapping technique.

The overall feasibility of the above-described techniques were successfully demonstrated. T2 maps generated with the proposed technique in phantom experiments and in vivo were of good quality even in challenging applications, such as the abdomen with acquisition time limited to a single breath-hold. With T1-correction, accurate T2 measurements were demonstrated quantitatively in phantoms and qualitatively in vivo. In the in vivo experiments, the agreement between the proposed method and the values reported in literature and SE as reference showed promise for accurate quantitative applications.

Compared with traditional SE-based T2 mapping and T2-prep-based methods, the proposed method reduces acquisition time and renders quantitative T2 mapping feasible for many clinical applications, including those that require short breath-holds. Compared with, for example, DESPOT2, the systems and methods of the present disclosure requires fewer GRE source images for parametric mapping and consequently achieves shorter scan time. Further, the systems and methods of the present disclosure are also generally immune to signal voids caused by banding artifacts. Compared with TESS T2 mapping technique, T2 weighting and T2* weighting in the signals of the proposed methods are naturally separated. The proposed techniques are also compatible with CSE-MRI, which is useful in many extra-cranial imaging applications.

T1-correction was not necessary for accurate T2 measurements in the phantom. This is consistent with the insensitivity of the signal phase to T1 when T1 is long. In the applications where lengthy T1 can be assumed, T1-correction may not be necessary.

The present invention has been described in terms of one or more preferred embodiments, and it should be appreciated that many equivalents, alternatives, variations, and modifications, aside from those expressly stated, are possible and within the scope of the invention.

The invention claimed is:

1. A magnetic resonance imaging (MRI) system comprising:
    a magnet system configured to generate a polarizing magnetic field about at least a portion of a subject arranged in the MRI system;
    a plurality of gradient coils configured to apply magnetic gradients to the polarizing magnetic field;
    a radio frequency (RF) system configured to apply an excitation field to the subject and acquire MR image data from the subject;
    a computer system programmed to:
        control the plurality of gradient coils and the RF system to perform a gradient echo pulse sequence that includes varying a phase of an RF pulse of the gradient echo pulse sequence between repetitions and acquire complex MR data;
        process the complex MR data to determine signal contributions from transverse relaxation (T2) in the subject;
        generate a quantitative T2 map of the subject using the signal contributions from T2 in the subject;
    a display configured to receive the quantitative T2 map from the computer and display the quantitative T2 map.

2. The MRI system of claim 1, wherein the computer system is configured to vary the phase using at least two phase increments that are equal in magnitude and opposite in sign and wherein the computer system is configured to separate signal contributions from T2 from background phase effects by subtracting MR data acquired with the phase increments that are equal in magnitude and opposite in sign.

3. The MRI system of claim 1, wherein the computer system is configured to determine signal contributions of T2 and T1 using at least one of a model and lookup table.

4. The MRI system of claim 1, wherein the computer system is configured to determine signal contributions from T2 using:

$$\theta(\Delta\Phi, \alpha, TR | T_1, T_2) = \frac{(\angle S(\Delta\Phi, \alpha, TR | T_1, T_2) - \angle S(-\Delta\Phi, \alpha, TR | T_1, T_2))}{2};$$

where $\theta(\Delta\Phi, \alpha, TR | T_1, T_2)$ is signal phase of the complex MR data as a function of the phase increment ($\Delta\Phi$), flip angle ($\alpha$) repetition time of the pulse sequence (TR), latitudinal relaxation time (T1), and longitudinal relaxation time (T2), and $S(T1,T2;\Delta\Phi, \alpha, TR)$ is a gradient signal acquired using the gradient echo pulse sequence.

5. The MRI system of claim 1, wherein the computer system is configured to determine signal contributions of T2 and T1 using:

$$\frac{S_1}{S_2} = \frac{\eta(\Delta\Phi_1, \alpha_1, TR | T_1, T_2)}{\eta(\Delta\Phi_2, \alpha_2, TR | T_1, T_2)} e^{i(\theta(\Delta\Phi_1, \alpha_1, TR|T_1,T_2) - (\theta(\Delta\Phi_2, \alpha_2, TR|T_1,T_2))}$$

where $\theta(\Delta\Phi, \alpha, TR | T_1, T_2)$ is signal phase of the complex MR data as a function of the phase increment (66 $\Phi$), flip angle ($\alpha$) repetition time of the pulse sequence (TR), latitudinal relaxation time (T1), and longitudinal relaxation time (T2); where $\eta(\Delta\Phi, \alpha, TR|T_1, T_2)$ is the signal magnitude relative to magnetization at thermal equilibrium ($M_0$); and $S(T1,T2;\Delta\Phi, \alpha, TR)$ is a gradient signal acquired using the gradient echo pulse sequence.

6. The MRI system of claim 1, wherein the computer system is configured to include a gradient in at least some repetitions of the gradient echo pulse sequence to encode diffusion weighting in the complex MR data.

7. The MRI system of claim 6, wherein the computer system is configured to generate at least one of a diffusion-weighted image or an apparent diffusion coefficient (ADC) map of the subject from the complex MR data.

8. The MRI system of claim 1, wherein the computer system is configured to control the plurality of gradient coils and the RF system to perform the gradient echo pulse sequence to acquire the complex MR data, wherein a flip angle and the phase of the RF pulse is varied between repetitions and wherein computer system is further configured to determine at least one of the flip angle, or B1 inhomogeneity from the data.

9. The MRI system of claim 1, wherein the phase using a phase increment that is less than 12 degrees.

10. The MRI system of claim 1, wherein the computer system is configured to generate the quantitative T2 map using a lookup table to derive estimates of T1 and T2.

11. The MRI system of claim 1, wherein the display is configured to display an image of the subject.

12. The MRI system of claim 10, wherein the image of the subject includes at least one of a T1-weighted image, a T2-weighted image, a $B_1$ map, or a diffusion-weighted image displayed by the display.

13. A method for producing at least one of an image or a quantitative map of a subject comprising:
controlling a magnetic resonance imaging system to perform a gradient echo pulse sequence that includes varying a phase of an RF pulse of the gradient echo pulse sequence between repetitions and acquire complex MR data;
processing the complex MR data to determine signal contributions from transverse relaxation (T2) in the subject;
generating a quantitative T2 map of the subject using the signal contributions from T2 in the subject;
displaying the quantitative T2 map.

14. The method of claim 13, wherein varying the phase includes using at least two phase increments that are equal in magnitude and opposite in sign and further comprising separating signal contributions from T2 from background phase effects by subtracting MR data acquired with the phase increments that are equal in magnitude and opposite in sign.

15. The method of claim 13, further comprising determining signal contributions of T2 using:

$$\theta(\Delta\Phi, \alpha, TR | T_1, T_2) = \frac{(\angle S(\Delta\Phi, \alpha, TR | T_1, T_2) - \angle S(-\Delta\Phi, \alpha, TR | T_1, T_2))}{2};$$

where $\theta(\Delta\Phi, \alpha, TR | T_1, T_2)$ is signal phase of the complex MR data as a function of the phase increment ($\Delta\Phi$), flip angle ($\alpha$) repetition time of the pulse sequence (TR), latitudinal relaxation time (T1), and longitudinal relaxation time (T2); and $S(T1,T2;\Delta\Phi, \alpha, TR)$ is a gradient signal acquired using the gradient echo pulse sequence.

16. The method of claim 13, further comprising determining signal contributions of T2 using:

$$\frac{S_1}{S_2} = \frac{\eta(\Delta\Phi_1, \alpha_1, TR | T_1, T_2)}{\eta(\Delta\Phi_2, \alpha_2, TR | T_1, T_2)} e^{i(\theta(\Delta\Phi_1, \alpha_1, TR|T_1,T_2) - (\theta(\Delta\Phi_2, \alpha_2, TR|T_1,T_2))}$$

where $\theta(\Delta\Phi, \alpha, TR | T_1, T_2)$ is signal phase of the complex MR data as a function of the phase increment ($\Delta\Phi$), flip angle ($\alpha$) repetition time of the pulse sequence (TR), latitudinal relaxation time (T1), and longitudinal relaxation time (T2); where $\eta(\Delta\Phi, \alpha, TR|T_1, T_2)$ is the signal magnitude relative to magnetization at thermal equilibrium ($M_0$); and $S(T1,T2;\Delta\Phi, \alpha, TR)$ is a gradient signal acquired using the gradient echo pulse sequence.

17. The method of claim 13, wherein each repetition of the gradient echo pulse sequence includes varying RF phase and flip angle of the RF pulse and further comprises determining signal contributions of T2 and T1 using at least one of a model and lookup table.

18. The method of claim 13, further comprising including a gradient in at least some repetitions of the gradient echo pulse sequence to encode diffusion weighting in the complex MR data.

19. The method of claim 18, further comprising generating at least one of a diffusion-weighted image or an apparent diffusion coefficient (ADC) map of the subject from the complex MR data.

20. The method of claim 13, wherein the computer system is configured to control the plurality of gradient coils and the RF system to perform at least two repetitions of the gradient echo pulse sequence to acquire the MRI data, wherein a flip angle and the phase of the RF pulse is varied between repetitions and wherein computer system is further configured to determine the flip angle from the data.

21. The method of claim 13, wherein the phase is varied using an increment that is less than 20 degrees.

22. The method of claim 13, further comprising generating the quantitative T2 map using a lookup table to derive estimates of T1 and T2.

23. The method of claim 13, further comprising reconstructing an image of the subject from the complex MR data and displaying the image.

24. The method of claim 23, wherein the image of the subject includes at least one of a T1-weighted image, a T2-weighted image, $B_1$ inhomogeneity map, flip angle map, and a diffusion-weighted image.

* * * * *

UNITED STATES PATENT AND TRADEMARK OFFICE
CERTIFICATE OF CORRECTION

PATENT NO. : 10,845,446 B2
APPLICATION NO. : 16/393806
DATED : November 24, 2020
INVENTOR(S) : Scott B. Reeder et al.

Page 1 of 1

It is certified that error appears in the above-identified patent and that said Letters Patent is hereby corrected as shown below:

In the Specification

Column 10, Line 34, "W))" should be --($\Delta\Phi$)--.

Column 10, Line 49, "W))" should be --($\Delta\Phi$)--.

Signed and Sealed this
Twenty-sixth Day of January, 2021

Drew Hirshfeld
*Performing the Functions and Duties of the
Under Secretary of Commerce for Intellectual Property and
Director of the United States Patent and Trademark Office*